United States Patent
Garland et al.

(10) Patent No.: US 8,456,152 B2
(45) Date of Patent: Jun. 4, 2013

(54) DIGITAL MULTIMETER WITH CONTEXT-SENSITIVE EXPLANATORY INFORMATION

(75) Inventors: Anthony Garland, Camano Island, WA (US); Joseph Ferrante, Redmond, WA (US); Christopher Gloger, Seattle, WA (US)

(73) Assignee: Fluke Corporation, Everett, WA (US)

(*) Notice: Subject to any disclaimer, the term of this patent is extended or adjusted under 35 U.S.C. 154(b) by 257 days.

(21) Appl. No.: 12/192,100

(22) Filed: Aug. 14, 2008

(65) Prior Publication Data

US 2009/0128124 A1   May 21, 2009

Related U.S. Application Data

(63) Continuation-in-part of application No. 11/838,881, filed on Aug. 14, 2007, now Pat. No. 7,626,375.

(51) Int. Cl.
*G01R 1/38* (2006.01)
(52) U.S. Cl.
USPC .......................................... 324/115; 324/141
(58) Field of Classification Search
USPC .................... 324/115, 121 R, 141
See application file for complete search history.

(56) References Cited

U.S. PATENT DOCUMENTS

| | | | |
|---|---|---|---|
| 4,352,164 A | 9/1982 | Reed et al. | |
| 4,532,470 A | 7/1985 | Wiesmann | |
| 4,736,327 A | 4/1988 | Power | |
| 4,825,392 A | 4/1989 | Freeman | |
| 4,908,775 A | 3/1990 | Palusamy et al. | |
| 4,912,657 A * | 3/1990 | Saxton et al. | 715/853 |
| 4,967,143 A | 10/1990 | Raviglione et al. | |
| 5,119,019 A | 6/1992 | George | |
| 5,218,290 A | 6/1993 | Beckert et al. | |
| 5,250,893 A | 10/1993 | Gambill et al. | |
| 5,256,975 A | 10/1993 | Mellitz et al. | |
| 5,321,701 A | 6/1994 | Raymond et al. | |
| 5,371,842 A | 12/1994 | Easton et al. | |
| 5,432,706 A | 7/1995 | Meldrum et al. | |
| 5,508,754 A | 4/1996 | Orphan | |
| 5,511,108 A | 4/1996 | Severt et al. | |
| 5,530,373 A | 6/1996 | Gibson et al. | |
| 5,541,840 A | 7/1996 | Gurne et al. | |
| 5,714,878 A | 2/1998 | Saito et al. | |
| 5,731,842 A | 3/1998 | Suzuki | |

(Continued)

FOREIGN PATENT DOCUMENTS

| | | |
|---|---|---|
| CN | 2524246 Y | 12/2002 |
| DE | 197 12 078 A1 | 10/1998 |

(Continued)

OTHER PUBLICATIONS

EP Search Report; EP Application No. 08162430.6-2216; Dated Dec. 4, 2008; 8 pages.

(Continued)

*Primary Examiner* — Arleen M Vazquez
(74) *Attorney, Agent, or Firm* — Perkins Coie LLP

(57) ABSTRACT

A digital multimeter provides information regarding measurements shown on a display of the multimeter, and available functions of the multimeter. The information typically relates to a current context of the multimeter. The context may include a current mode or other setting of the multimeter.

24 Claims, 11 Drawing Sheets

U.S. PATENT DOCUMENTS

| | | |
|---|---|---|
| 5,923,161 A | 7/1999 | Frankovitch, Jr. et al. |
| 6,122,669 A | 9/2000 | Crayford |
| 6,140,811 A | 10/2000 | Little |
| 6,181,992 B1 * | 1/2001 | Gurne et al. .................. 701/29 |
| 6,301,547 B2 | 10/2001 | Felps |
| 6,340,892 B1 | 1/2002 | Rynhart et al. |
| 6,459,968 B1 | 10/2002 | Kochie |
| 6,492,910 B1 | 12/2002 | Ragle et al. |
| 6,556,003 B2 | 4/2003 | Choi |
| 6,667,610 B2 | 12/2003 | Piesinger |
| 7,216,108 B2 * | 5/2007 | Hastings et al. ............. 705/63 |
| 7,418,384 B2 | 8/2008 | Okutani |
| 7,468,602 B2 | 12/2008 | Sleeman et al. |
| 7,626,375 B2 | 12/2009 | Garland et al. |
| 7,679,356 B2 | 3/2010 | Garland et al. |
| 2003/0058280 A1 | 3/2003 | Molinari et al. |
| 2007/0100520 A1 * | 5/2007 | Shah et al. .................... 701/33 |
| 2007/0176933 A1 | 8/2007 | Culpi et al. |
| 2007/0225575 A1 * | 9/2007 | Kilborn et al. ............... 600/301 |

FOREIGN PATENT DOCUMENTS

| | | |
|---|---|---|
| EP | 0487174 A2 | 5/1992 |
| EP | 0 504 514 | 9/1992 |
| JP | 55 027907 A | 2/1980 |
| JP | 06 258356 A | 9/1994 |
| JP | 2001 311747 | 11/2001 |
| KR | 2006004031 A | 1/2006 |

OTHER PUBLICATIONS

EP Search Report; EP Application No. 08162447.0-1524; Applicant: Fluke Corporation; Mailed Nov. 19, 2008; 24 pages.

Chinese Patent Application No. 200810161112.X, Office Action, 7 pages, Nov. 25, 2011.

European Patent Application No. 11174639.2, Extended European Search Report, 6 pages, Sep. 9, 2011.

European Patent Application No. 11174651.7, Extended European Search Report, 6 pages, Sep. 6, 2011.

* cited by examiner

DIGITAL MULTIMETER WITH CONTEXT-SENSITIVE EXPLANATORY INFORMATION

CROSS-REFERENCE TO RELATED APPLICATIONS

This application is a continuation-in-part of U.S. patent application Ser. No. 11/838,881, filed Aug. 14, 2007, the disclosure of which is hereby incorporated by reference in its entirety. This application claims priority under 35 U.S.C. §120 to U.S. patent application Ser. No. 11/838,881.

BACKGROUND

Multimeters are used for measuring a variety of parameters associated with electrical circuitry, such as currents, voltages, resistances, and capacitances. Multimeters commonly include rotary switches for selecting between different measurement functions. For example, a rotary switch on a conventional multimeter may be configured such that a first position of the rotary switch corresponds to a voltage measurement function, a second position of the rotary switch corresponds to a current measurement function, and a third position of the rotary switch corresponds to a resistance measurement function.

Modern digital multimeters commonly provide many different measurement functions. Accordingly, to save space on these multimeters, researchers have developed rotary switches where each position of the rotary switch corresponds to more than one measurement function. As examples, a single position of a rotary switch may correspond to different units of measurement, such as Amps ("A") and milliamps ("mA"), or different measurement types altogether, such as current measurement and temperature measurement. These multimeters generally allow a user to switch between the different measurement functions associated with a particular position of the rotary switch by actuating a separate button or switch while maintaining the rotary switch in the same position.

Another feature found in modern digital multimeters enables a user to select between different modes that affect what or how measurements are acquired, maintained, and displayed. For example, a user can select a "Minimum/Maximum" (Min/Max) mode, which updates a display with minimum and maximum detected measurement values. As another example, a user can select a "Record" mode to record measurement values for memory storage and later retrieval.

In sum, conventional digital multimeters incorporate various tools for performing different types of measurements and different capabilities for displaying measurement values in a digital format on a screen. Further capabilities and improvements are needed, however, in both hardware and software, to enable users to organize measurement information to be obtained by the instrument so as to operate the instrument efficiently, effectively, and safely.

DETAILED DESCRIPTION

Figure 1:
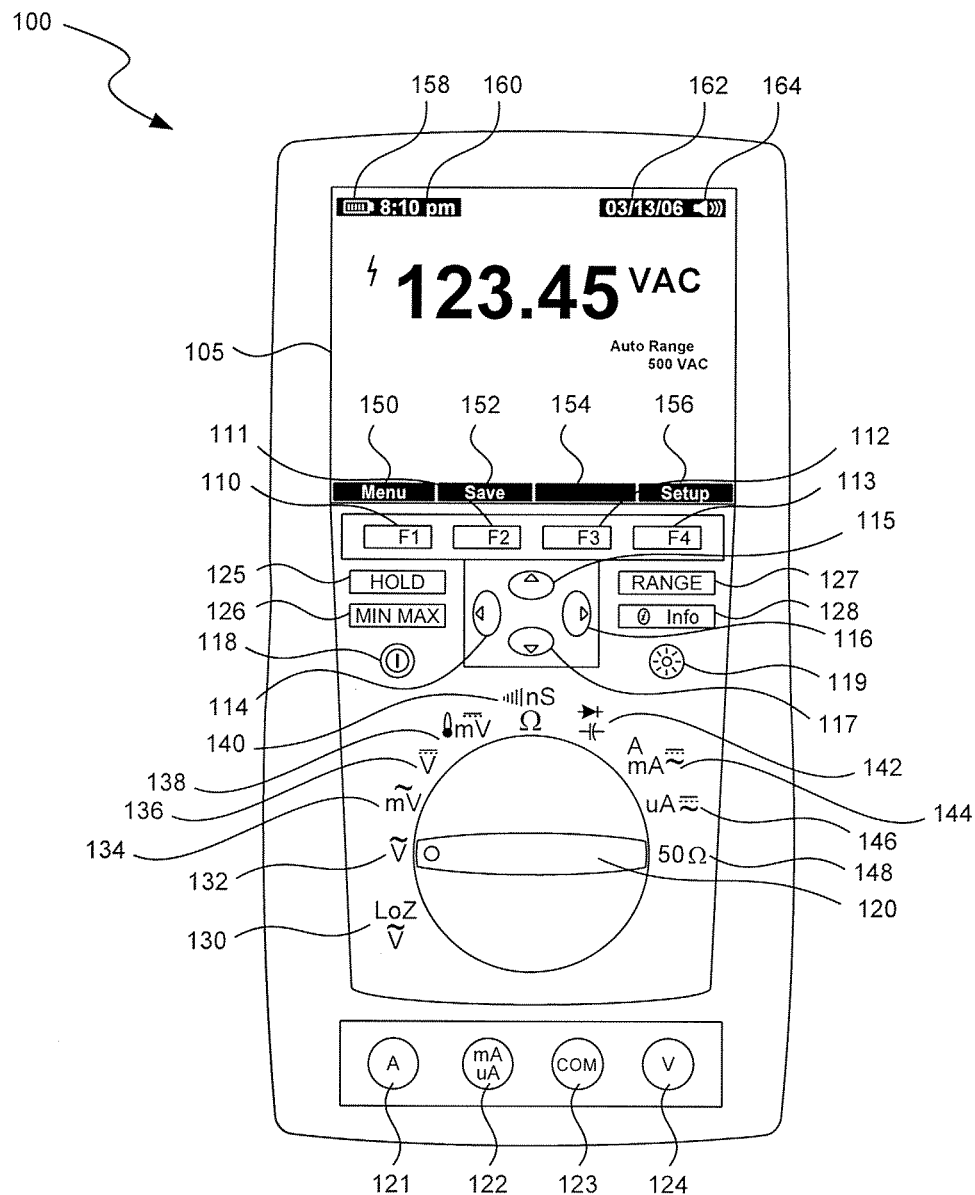
FIG. 1 illustrates a front face of a digital multimeter in accordance with an exemplary embodiment.

An inventive digital multimeter and inventive methods for operating the digital multimeter are disclosed below in detail. The digital multimeter incorporates a rotary switch, a set of keys and buttons, and a digital display so as to provide highly integrated, programmable and configurable features not available on conventional multimeters. Several of these features, either taken alone or in combination, provide significant improvements in ease of use, speed of user operation, and safety associated with use of the digital multimeter. Modifications, alterations, and additions to conventional multimeters that were necessary to accomplish these features have resulted in benefits that otherwise would not have been foreseen or appreciated by others skilled in the art.

In one embodiment, a digital multimeter has informative display features including a display for displaying measurement values and available functions of the multimeter and a user interface for inputting or accessing information, inputting commands, or browsing through various multimeter functions. Graphical icons and/or words presented in the display indicate the potential functions of the multimeter. The multimeter also usually has a memory for storing information, including context-sensitive explanatory information, information on how to use or perform a function or mode of the multimeter, safety information, and measurement data information collected by the multimeter. This information may be accessed via an information (or Info/"i") button. The multimeter also typically has a processor, which retrieves information from the memory and shows the retrieved information on the display. Preferably, the digital multimeter is portable and can information transferred to and from an external storage medium, such as an external computer. User input is achieved through actuating one or more buttons or switches on the multimeter.

A multimeter may present detailed graphical representations of data collected. For example, the multimeter may represent trends in the data, which can be used for visualizing a large amount of data at once or documenting performance of multimeter designs, processes or systems. It is useful for monitoring and displaying unattended multimeter use, such that a user could return to a multimeter and quickly review large amounts of data, allowing the user to see overall trends and data anomalies. In one embodiment, a user has the ability to "zoom in" or "zoom out" on graphical trend data to better analyze the data in a desired perspective on the meter screen. Preferably, the multimeter can store and graph can display at least 5,000 data readings, more preferably at least 10,000 data readings.

The display of the multimeter may have a display box that appears over the first display screen, which is called a "pop-up" box. The pop-up box may display pictures, graphics, video, charts or text. In one alternative, the text indicates and explains the available functions of the multimeter. A user may scroll through information listed on either the main display screen or in the pop-up box with an associated scrolling mechanism. The pop-up box may also comprise a title bar, which displays information regarding the multimeter functions in operation at the time when the user input was received. When the pop-up box is displayed, the box may also display smaller versions of the measurement value or values shown on the larger display screen.

In another embodiment, a digital multimeter presents multiple measurements and other information in fonts of various sizes and in various locations on a multimeter display. The digital multimeter has means, including inputs, for gathering various measurements, including electrical measurements and a display, which has various regions or areas within the display. The first region of the display is centrally-located, i.e., in the middle of the display area, which is typically a screen. The second region is peripherally-located, which means that it may be above, below, or to the side of the centrally-located region and may abut the centrally-located region. A primary reading value of an electrical measurement may appear in either the first region or second region or may be in both regions. In another embodiment, the display simultaneously displays both a primary reading value of an electrical measurement and another item, which may be a derivative reading value of the electrical measurement, a dialog, a menu, another value or any combination thereof. If the derivative reading value is displayed, the primary reading value and the derivative reading value are preferably based upon the same electrical property.

In a related embodiment, the multimeter display uses a larger font in the centrally-located (i.e., main) portion of the display than it does in the peripherally-located portion of the display. The font size difference may be any difference such that the centrally-located font is larger, but is preferably larger by at least 25%, and more preferably, larger by at least 50%. If the second region displays the primary reading value, the first region may display one or more of various types of information, including a derivative reading value, a dialog, a menu, or a saved measurement value.

The multimeter may also provide ongoing monitoring of dangerous electrical conditions by showing a warning message on the display. In one embodiment, the results of the monitoring are displayed in the second area of the display. The multimeter can be set or programmed to display a warning message accompanying the primary reading value when the primary reading value is greater than a predetermined limit. This functionality provides additional safety for the user because, no matter what display is occurring in the center of the screen, the user can be apprised of potentially dangerous situations. The warning message may be any symbol or text which would indicate that the reading has exceeded the preset safety level. In certain embodiments, the warning message is a lightning bolt, flashing text, a flashing status bar, a flashing screen, a red screen, an alarm sound, such as a repeated beeping, or any combination thereof so that the warning message causes the user's attention to turn to the excessive value reading.

In another embodiment, the display may be used to show comparisons between values. For example, the primary reading value may be a relative value indicating a difference between an electrical condition and a reference value. The primary reading value may be displayed anywhere on the display, including in the first or second region. Various value comparisons may be displayed in both the first and second region simultaneously. The display may have an indication, such as an icon accompanying the value, that the value displayed is a relative value as opposed to an absolute value or a raw measurement.

In yet another embodiment, a digital multimeter comprises a display for showing measurement values associated with at least one electrical characteristic of an electrical circuit, a user interface for receiving a user input to select a mode governing a display format of the measurement values, a memory for storing an indication of the mode, and a processor for retrieving the indication of the mode from the memory, determining measurement values associated with the electrical circuit based on input to the multimeter, and generating display data for the measurement values in accordance with the mode. When the mode is a live-measurement mode, live actual measurement values are displayed in a normal font size in a central portion of the display. However, when the mode is not a live-measurement mode, live actual measurement values are displayed in a smaller than normal font size in a status bar in a peripheral portion of the display while other measurement values are displayed in the central portion of the display. In one embodiment, when the multimeter is in a mode that is not a live-measurement mode, the status bar at the top of the screen is "inversed," meaning that white characters in the black status bars turn black and the black background of the status bars turns white or otherwise reverses the contrast between the bar background and the text. The status bar may be inversed when the meter is in HOLD, AutoHOLD or AutoSAVE mode, when the user is viewing readings from memory (as opposed to live readings), and when a recording, Min Max, or Peak session has been stopped, but has not yet been closed. An inversed status bar is designed to provide the user with a visual reminder that the values on the central portion of the display are not live measurement values.

A multimeter may also store a voltage threshold value in the memory. A voltage threshold value is an electrical value, a reading above which may indicate a dangerous condition in the vicinity of the multimeter. When the processor determines that any live actual measurement value displayed in the status bar is greater than the stored voltage threshold value, a warning message is displayed. As explained with respect to the above embodiments, the warning message may be any indication that the voltage threshold value has been reached or exceeded, including flashing words or symbols, including a lightning bolt, warning colors, warning sounds, or warning words such as "danger" or "threshold exceeded." A multimeter may also display live actual measurement values in the status bar when the mode is a hold mode and a frozen past measurement is displayed in the central portion of the display. The multimeter may comprise a status bar or bars with one or more of a battery strength indicator, a time, or a date.

Methods of operating digital multimeters of the present invention are also disclosed. In one embodiment, the method comprises displaying live measurements within a main area of a display of the multimeter, detecting whether a user has selected a mode for the multimeter, upon detecting that the user has selected a mode for the multimeter, retrieving from a memory, display parameters corresponding to the selected mode, determining whether the display parameters indicate that the live measurements have been removed from the main area of the display, and upon making such a determination, dynamically reconfiguring a status bar within the display to include a smaller-sized or miniature representation of the live measurements. Methods of using the multimeter may also comprise retrieving a voltage threshold value from the memory, comparing the live measurements with the voltage threshold value, and, if one or more of the live measurements exceeds the voltage threshold value, displaying a warning message on the display, which may be displayed in the status bar or in the main display area and may be any of the warning messages described herein.

In another embodiment, a digital multimeter has a rotary switch memory and a rotary switch that has more than one position. Preferably, the rotary switch will have more than two positions, and more preferably, more than three positions. Each position on the rotary switch is associated with a "default" primary measurement function, which is the function that the multimeter performs or reverts to if the associated memory does not store a different function at that position. Additionally, at least one position on the rotary switch is associated with one or more non-default primary measurement functions. In one embodiment, each position on the rotary switch has one default and one non-default primary measurement functions. Alternatively, each position on the rotary switch may have one default and multiple non-default primary measurement functions. A further alternative is that some positions of the rotary switch have only a default primary measurement function and other positions have both default and non-default primary measurement functions. A multimeter user may control and program the multimeter to accommodate the user's needs.

The multimeter of the present invention has a processor, which allows for modification of the primary measurement function selected at a given time for a position on the multimeter ("active primary measurement function") and a memory for storing such associations. For each position on the rotary switch, the active primary measurement function may change from default to non-default, non-default to default, or from one non-default function to a different non-default function. The processor processes and memory stores the active primary measurement and, when the multimeter is switched to a given position on the switch, the process retrieves the active primary measurement function from the rotary switch memory and causes the multimeter to perform the active primary measurement function. The rotary switch memory may also store a mode associated with an active primary measurement function, such that the multimeter performs the active primary measurement function in accordance with the associated mode (such as max/min, hold, etc.)

In certain embodiments, the multimeter stores the active primary measurement functions from each position on the switch even when the multimeter is turned off or the multimeter is powered down and then resumes performance of the active primary measurement function in response to the multimeter being turned back on or powered up. In other embodiments, powering down/turning off the multimeter automatically resets one or more of the active primary measurement functions to the default primary measurement functions. User input can determine whether the active primary measurement is saved or not. The digital multimeter may also have a mechanism for disabling the rotary switch memory, so that the multimeter only performs the default measurement functions associated with a particular position when the disabling mechanism is activated. The memory still retains its non-default position information, however, and can provide that information to the processor when the memory-disabling mechanism is turned off.

In yet another embodiment, the rotary switch memory also stores an active secondary measurement function associated with the active primary measurement function, and the multimeter performs the active secondary measurement function in conjunction with performing the active primary measurement function. The memory may associate the secondary measurement functions with both default and non-default primary measurement functions.

The digital multimeter may have a reset mechanism, which clears the rotary switch memory. After the reset mechanism is activated, the multimeter will perform the default primary measurement function associated with a particular position on the rotary switch. Preferably, reset mechanism has safeguards so that the memory will not be cleared by accident. The user can also customize the rotary switch in any combination or permutation of the various functionalities described herein, including locking the active primary and/or secondary measurement functions at certain locations on the rotary switch, preventing the rotary switch memory from storing non-default primary measurement functions for selected positions of the rotary switch, and resetting one position of the rotary switch without modifying the active primary measurement functions associated with other positions of the rotary switch.

In another embodiment, a multimeter is connected to an external central processing unit or computer. The multimeter may be connected to the external computer before, during, and/or after use. Transfer of data between the multimeter and the computer may occur both ways. For example, the multimeter can be connected to the computer and the computer can download a new set of operating instructions to the multimeter. This is a significant advantage because the multimeter can be updated with new software programs and new versions of existing programs without having to replace the memory of the multimeter. Conversely, the multimeter can upload saved data from its memory into the external computer, thus freeing up more space for additional measurements. If the external computer is connected to the multimeter during use, the processor of the computer and the processor the multimeter can work in tandem to process the data being acquired by the multimeter. The data acquired can then either be saved to the memory of the multimeter or the external computer or both.

Additional optional features of a multimeter include a low impedance voltage function to prevent false readings due to "ghost voltage." Separately, a low pass filter function allows test of ac voltage output, and tests for accurate voltage and frequency measurements on adjustable speed motor drives and other electrically noisy equipment. Finally, a "50 Low Ω" feature allows testing of resistance up to 50 ohms with one milliohm resolution and is useful for testing motor windings or contact resistance or other areas where making reliable low resistance readings is required.

The many embodiments of a digital multimeter described herein may be used alone or in any combination or permutation. For example, a multimeter with a rotary switch and rotary switch memory may also have a mini-measurement feature and an information button. One skilled in the art will appreciate the variety of features for a digital multimeter, which are further described herein with respect to the figures.

Description of Components in a Highly-Integrated Multimeter Instrument

FIG. 1 illustrates a front face of an example multimeter 100. Multimeter 100 typically comprises a compact, handheld body, including contour indentations improving suitability for one-handed operation. The face of multimeter 100 is generally characterized by a display 105, a rotary switch 120, soft keys 110-113, navigation buttons 114-117, dedicated buttons 125-128, and various input jacks 121-124. Multimeter 100 can be powered by AA alkaline batteries (not shown) or another suitable power supply.

Measurement Functions and Modes

Multimeter 100 may provide primary measurement functions, such as functions for measuring voltage, current, temperature, resistance, electrical continuity, conductance, capacitance, diode test, low impedance, low resistance (e.g., 50 Ohms), and AC/DC combinations ("AC+DC", "AC,DC"). Additionally, multimeter 100 may further provide secondary measurement functions, which are functions for measuring secondary characteristics of signals or measurements generated by the primary measurement functions. Examples of secondary measurement functions include functions for measuring signal frequency, duty cycle, pulse width, decibels, and crest factor. Although multimeter 100 performs only one primary measurement function at a time, it may simultaneously perform a primary measurement function and one or more secondary measurement functions.

Multimeter 100 may be set to certain modes that operate in conjunction with various measurement functions. These modes determine how measurements are acquired and represented without changing the measurement function. Examples of these modes include "Min/Max," "Hold," "Range," "Peak," and "Record" modes. "Min/Max" mode is a mode in which multimeter 100 displays minimum, maximum, and average measurements that have occurred over a period of time. In this mode, whenever a new maximum or minimum occurs—exceeding the previous maximum or minimum—the new maximum or minimum is stored and displayed. "Hold" mode is a mode in which a displayed value is frozen on the display. Manual "Range" mode is a mode in which a range, or resolution, of a displayed value is specified by user input. Auto "Range" mode is a mode in which a range of a displayed value is determined by the multimeter. Both Auto Range and Manual Range may be accessed via the RANGE button. "Recording" mode is a mode in which a sequence of measurements of a parameter is recorded over a period of time for future review or storage. As an example, a sequence of multiple resistance measurements obtained at different parts of a circuit can be recorded using the "record" mode.

User Input Components—Rotary Switch, Buttons, and Keys

User input components of multimeter 100 include, among other things, rotary switch 120, navigation buttons 114-117, soft keys 110-113, dedicated buttons 125-128, an on/off switch 118 and a backlight control button 119. Dedicated buttons 125-128 (also referred to as dedicated mode buttons) include an [Info] button 128, a [HOLD] button 125, a [MIN MAX] button 126, and a [RANGE] button 127. A user can interact with multimeter 100 using the various buttons and other features included on the face of multimeter 100. Additionally, the user's interactions can be guided by information presented on various screens of display 105. Further, multimeter 100 may present the user with output via display 105, an indicator light, and/or an audible beeper. Multimeter 100 further includes an internal memory for storing information such as measurement values.

Soft keys 110-113 are located in an area beneath the display 105 and positioned to correspond with labels 106-109 on the display. Pressing one of the soft keys 110-113 invokes the command indicated by the corresponding label on the display. Every screen shown on display 105 has a custom set of soft key labels 106-109. Some screens have fewer soft key labels than soft keys. When a soft key label is left blank, the corresponding soft key is disabled. For example, in the screen shown in FIG. 1, soft key label "Menu" 150 corresponds to soft key "F1" 110, soft key label "Save" 152 corresponds to soft key "F2" 111, soft key label "Setup" 156 corresponds to soft key "F4" 113, and soft key label 154 is left blank, indicating that soft key "F3" 112 is disabled.

In the example of FIG. 1, navigation buttons 114-117 are centrally located among the other buttons of multimeter 100. Navigation buttons 114-117 correspond to four cardinal directions: [UP] 115, [DOWN] 117, [LEFT] 114, and [RIGHT] 116. Navigation buttons 114-117 can be used to move within menus and dialogs and to make choices and perform data entry. They can also be used to scroll through a sequence of information too extensive to be displayed on a single screen.

[Info] button 128 can provide access to context-sensitive explanatory information about a measurement function and display contents. Additional details regarding [Info] button 128 are discussed further below. The context-sensitive explanatory information may appear in a pop-up information dialog which covers a portion, including most or all, of the underlying screen.

Multimeter 100 may include a backlight for the display 105 to allow improved viewing in conditions of reduced light. The backlight is typically activated by backlight control button 119. Multimeter 100 can also include an On/Off button 118 used to turn multimeter 100 on or off.

Rotary switch 120 includes positions 130, 132, 134, 136, 138, 140, 142, 144, 146, and 148. Each of these positions corresponds to at least one primary measurement function of multimeter 100. These primary measurement functions are indicated by symbols about the periphery of rotary switch 120. Where more than one symbol is located next to a single position of rotary switch 120, the symbol closest to rotary switch 120 corresponds to a default primary measurement function for that position and any symbols located farther away from rotary switch 120 correspond to non-default primary measurement functions for that position. For instance, position 142 of rotary switch 120 corresponds to a default primary measurement function for capacitance measurement (indicated by a capacitance circuit symbol), and a non-default primary measurement function for diode testing (indicated by a diode circuit symbol). A user can change the primary measurement function currently associated with a particular position of rotary switch 120 by actuating specific buttons on the face of multimeter 100, as will be described in further detail below.

For explanation purposes, the term "active primary measurement function" will be used to refer to the primary measurement function currently associated with a particular position of rotary switch 120. In other words, the active primary measurement function for a particular position of rotary switch 120 is the function that is performed by multimeter 100 when rotary switch 120 is moved to the particular position. As will be appreciated, the active primary measurement function for a particular position of rotary switch 120 may be a default primary measurement function or a non-default primary measurement function.

As indicated by the various symbols around rotary switch 120, multimeter 100 may perform several different primary measurement functions. These primary measurement functions may include, for example, AC voltage measurement (e.g., from 0 V to 1000.0 V), AC millivolt measurement (e.g., from 0 mV to 3000.0 mV), DC voltage measurement (e.g., from 0 V to 1000.0 V0, DC millivolt measurement (e.g., from 0 mV to 3000.0 mV), resistance measurement (e.g., from 0Ω to 500.0 MΩ), capacitance measurement (e.g., from 0.001 nF to 50 mF), temperature measurement, AC current measurements (e.g., from 0 mA to 20,000 A), AC current measurements (e.g., from 0 µA to 5000.0 µA), DC current measurements (e.g., from 0 mA to 20,000 A), DC current measurements (e.g., from 0 µA to 5000.0 µA).

When rotary switch 120 is set to a particular position, multimeter 100 may be set to display a particular screen containing pertinent information related to the present primary measurement function. Each screen may present one or more menu items related to the present primary measurement function. These menu items may be presented by placing specific names on soft key labels 106-109. Accordingly, a user may select from the menu items by pressing the corresponding soft keys 110-113. As discussed below with reference to FIGS. 4 and 5, these menu items may, among other things, allow a user to switch between the different primary measurement functions associated with a current position of rotary switch 120.

Dedicated mode buttons 125-128 provide direct single-press access to different modes. Pressing [HOLD] button 125 may cause multimeter 100 to hold a currently displayed measurement value. Pressing [MIN MAX] 126 button may cause multimeter 100 to capture the highest, lowest, and average readings over a period of time. Pressing [RANGE] button 127 may cause multimeter 100 to prompt a user to manually select a desired measurement range. Other modes may be selected by using soft keys 110-113 and navigation buttons 115-117 to make selections from menus on display 105.

Multimeter 100 can be turned off and on again without losing its presently-employed settings. For instance, multimeter 100 can be turned off and on again without reverting from a non-default primary measurement function associated with a particular position of rotary switch 120 to a default primary measurement function associated with the same position. Similarly, multimeter 100 can be turned off and on again without reverting from a non-default mode associated with a particular position of rotary switch 120 to a default mode associated with the same position. Moreover, upon powering up, multimeter 100 can resume performance of any previously selected secondary measurement functions without requiring additional user input. In other words, multimeter 100 preserves specific user-configured settings even when turned off.

When rotary switch 120 changes from a first position to a second position, the screen of display 105 changes in accordance with a new measurement function associated with the second position. Typically, any modes or other configurations that have been designated for the first position are not maintained when rotary switch 120 changes to the second position. For instance, if multimeter 100 performs a first measurement in Hold mode while rotary switch 120 is at a first position, multimeter 100 will not necessarily maintain the Hold mode when rotary switch 120 is moved to a second position.

Multimeter 100 may receive input signals through probes or other input sources connected to input jacks 121-124. Multimeter 100 may produce output through display 105 and other output interfaces such as indicator lights or audio sources for generating a beeping noise. Multimeter 100 can include an internal memory for storing information such as measurement values.

Multimeter User Display

Display 105 may comprise an LCD screen or any other suitable type of display. In FIG. 1, rotary switch 120 is set to position 132, which corresponds to a voltage measurement for an alternating current. Accordingly, display 105 displays voltages measured by this measurement function. As shown in FIG. 1, some measurements may be displayed in a bold type and/or in a comparatively larger font size in relation to other displayed measurements. Display 105 may further display additional measurements or collateral information related to the displayed measurements.

Schematic Layout of Multimeter Circuitry and Components

Figure 2:
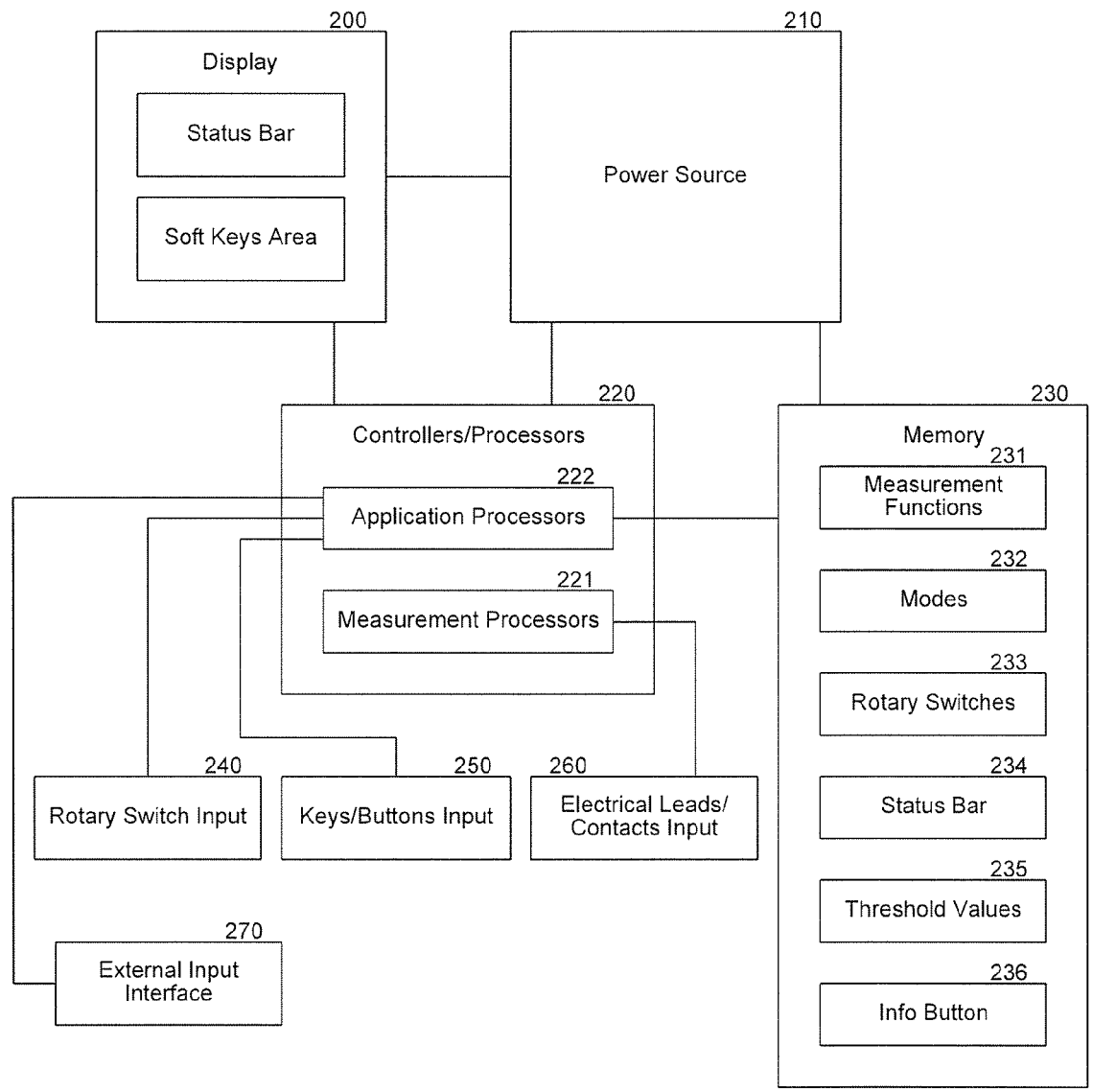
FIG. 2 is a schematic layout of various components of the digital multimeter.

FIG. 2 is a schematic layout illustrating various components of digital multimeter 100 in accordance with one example. In the example of FIG. 2, multimeter 100 comprises a digital display 200, a power source 210, controllers/processors 220, a memory 230, and input components 240, 250, 260, an external input interface 270.

Display 200 typically comprises an LCD screen or other suitable display. In some examples, display 200 is characterized as having a small footprint of approximately 6-8 square inches. Display 200 includes an area for a status bar 201 near an upper portion, and a soft keys area for displaying soft key labels. Display 200 receives data from controllers/processors 220 and power from power source 210.

In some examples, power source 210 comprises batteries to allow for portability. Alternatively or additionally, power source 210 may incorporate an AC adapter to receive power from a standard AC electrical outlet. Power source 210 is connected to display 200, controllers/processors 220, and memory 230.

In the example of FIG. 2, controllers/processors 220 include one or more application processors 222 and one or more measurement processors 221. In general, it should be recognized that the functionality of application processors 222 and measurement processors 221 can partitioned, combined, and implemented in a variety of different ways. For instance, various components of both processors can be implemented on the same chip, or distributed across many discrete and distinct electrical and/or logical components. Moreover, many components of application processors 222 and measurement processors 221 can be implemented in various combinations of hardware and/or software.

Application processors 222 typically comprise components for controlling other features of multimeter 100, and for receiving and processing inputs from input components 240, 250, and 260, measurement data from measurement processors 221, and stored data from memory 230. Measurement processors 221 typically comprise components for capturing measurement data provided through one or more electrical leads or contacts of input component 260. Several basic technologies for implementing the functions of controllers/processors 220 are well known and will therefore not be discussed in great detail.

Memory 230 typically comprises one or more volatile or nonvolatile memory devices. The one or more memory devices may store and retrieve data using any of several known techniques, architectures, database systems, and so on. In general, memory 230 stores information 231 and 232 respectively relating to various available measurement functions (e.g., V AC, V DC, ohms, etc.) and modes (e.g., auto-save, relative) of multimeter 100. Such information may be used, for instance, to control the operation of these functions and modes. Memory 230 further stores information 233 related to the state of rotary switch 120 and any current configurations (e.g., non-default primary measurement functions, modes) associated with different positions of rotary switch 120. Memory 230 further stores information 234 related to a status bar mini-measurement display, information 235 related to voltage threshold values for different modes, and information 236 related to an information button of multimeter 100.

Rotary Switch and Rotary Switch Memory

FIGS. 1 and 3-7 illustrate various screens associated with different positions of rotary switch 120. The information displayed in these screens is described in further detail below.

FIG. 1 illustrates a screen associated with position 132 of rotary switch 120. The screen of FIG. 1 displays a measured voltage "123.45 VAC".

Figure 3:
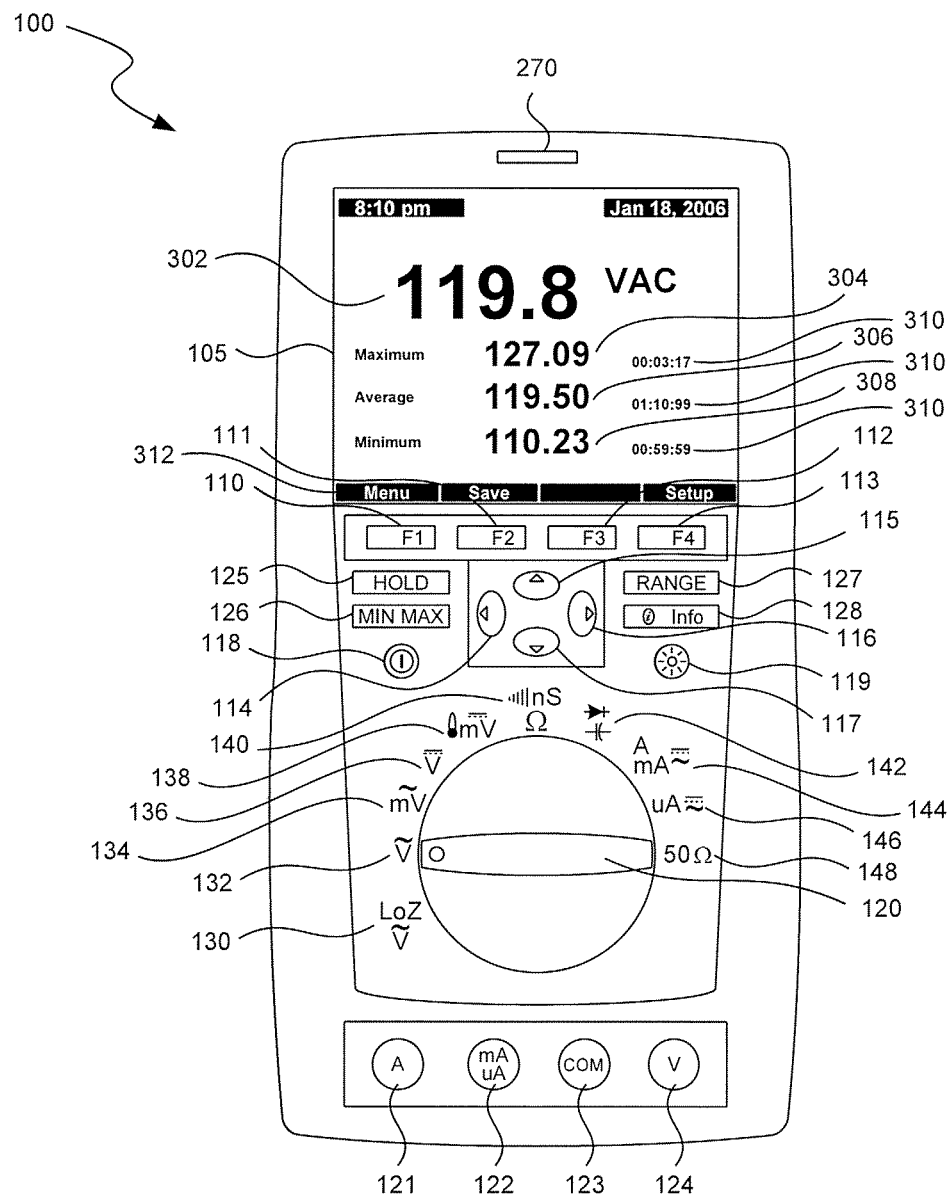
FIG. 3 illustrates a screen that can appear after a user has selected a Max/Min mode in the digital multimeter.

FIG. 3 illustrates a screen that appears when rotary switch 120 is in position 132 and a user presses [MIN MAX] button 126 to invoke the Min/Max mode. The screen of FIG. 3 displays a live voltage "119.8 VAC" (labeled 302), a maximum measurement value "127.09 VAC" (labeled 304), an average measurement value "119.50 VAC" (labeled 306), and a minimum measurement value "110.23 VAC" (labeled 308). Each of measurement values 304, 306, and 308 is accompanied by a time stamp 310 denoting a time when the measurement value was detected.

Figure 4:
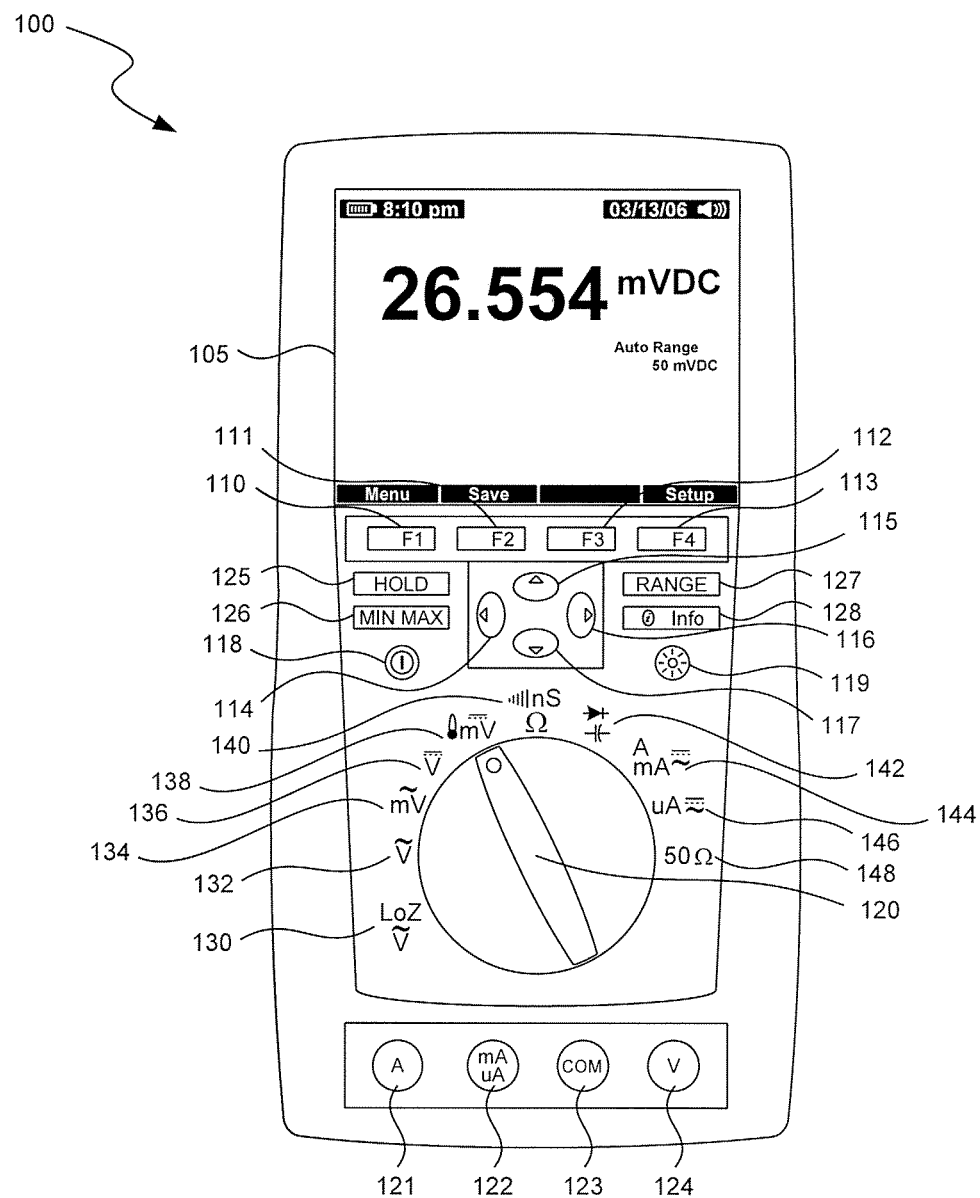
FIG. 4 illustrates a screen that can appear after a user has selected a function for measuring milli-volts of direct current (mVDC) in the digital multimeter.

FIG. 4 illustrates a screen displayed when a user selects the default primary measurement function associated with position 138 of rotary switch 120. In the disclosed example, the default primary measurement function associated with position 138 is a function for measuring mVDC. To access a non-default primary measurement function associated with position 138, a user may select soft key 110 to access a function and mode menu for changing the primary default function. The menu presents options for alternative primary measurement functions and modes and allows the user to select an alternative primary default function or mode for the current position of rotary switch 120.

Figure 5:
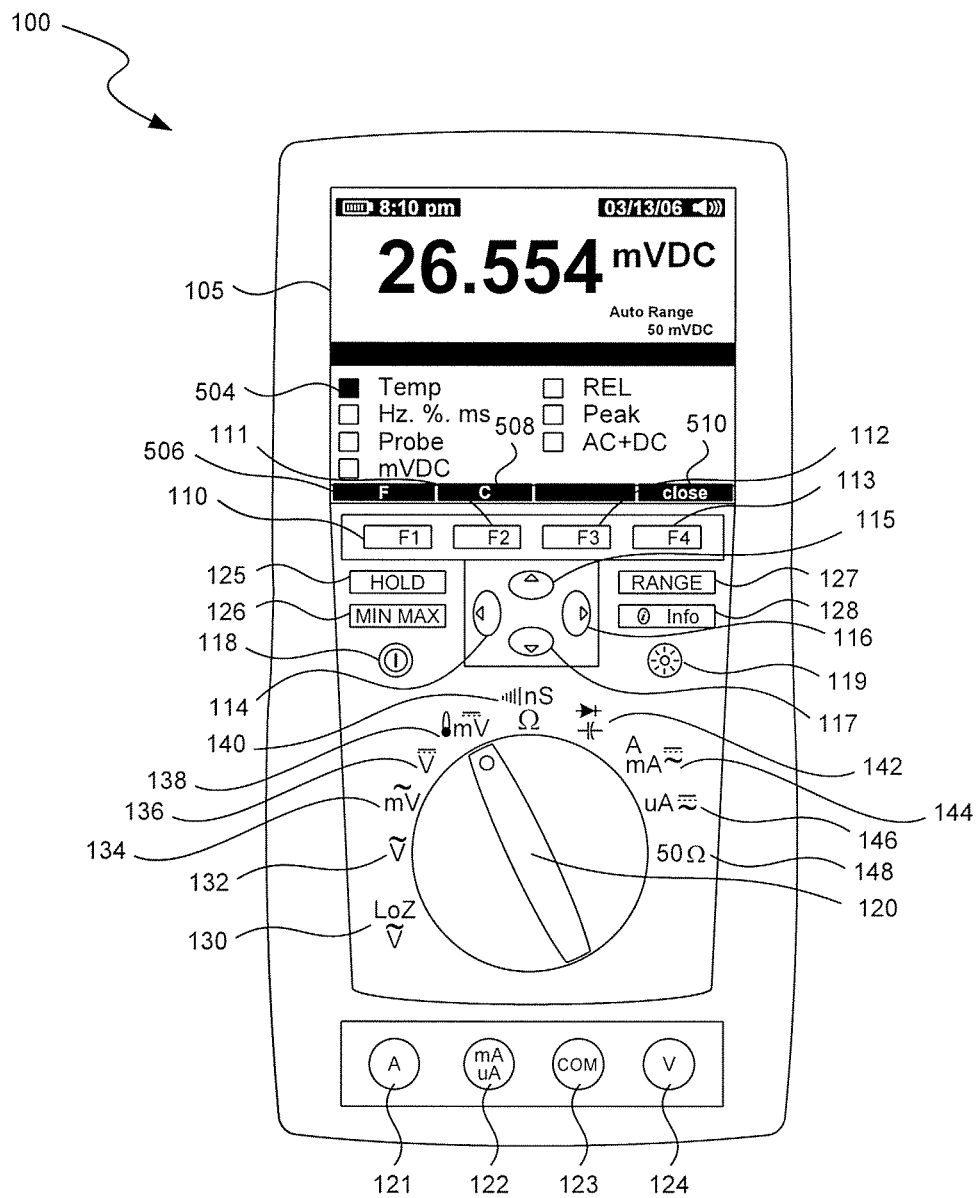
FIG. 5 illustrates an example of a function and mode menu for the digital multimeter.

FIG. 5 illustrates an example of the function and mode menu that can appear after the user presses soft key 110 in the screen of FIG. 4. In FIG. 5, a user has selected a temperature measurement function by using navigation keys 114-117 to highlight a box 504 located next to the label "Temp" as shown in FIG. 5. When box 504 is highlighted, the soft key labels corresponding to soft keys 110, 111, and 113 show an "F" (also labeled 506) for measurement in degrees Fahrenheit, a "C" (also labeled 508) for measurement in degrees Celsius, and "close" (also labeled 510) to close the function and mode menu and return to the screen of FIG. 4.

Figure 6:
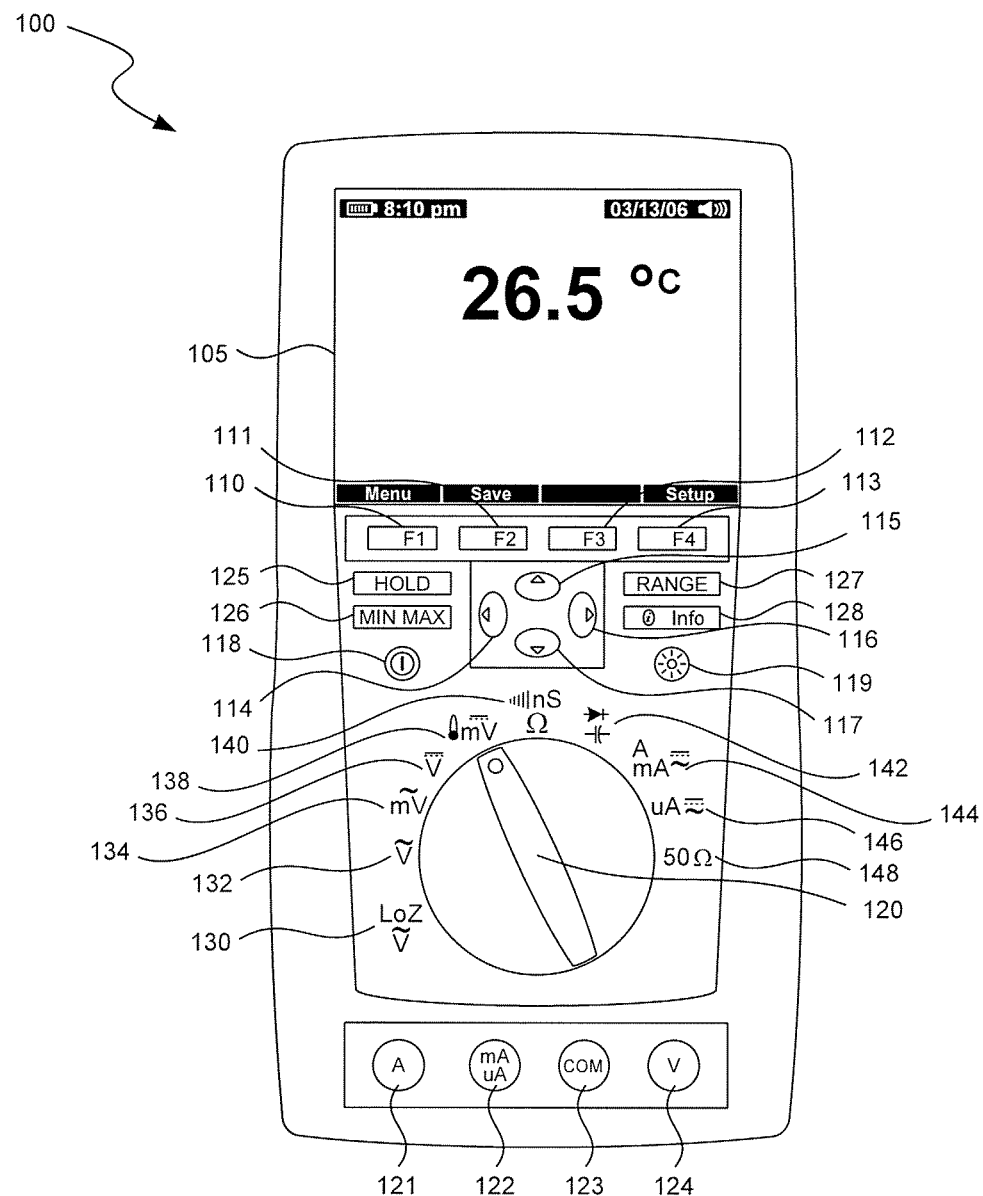
FIG. 6 illustrates a screen displaying a value of a measured temperature in the digital multimeter.
Figure 7:
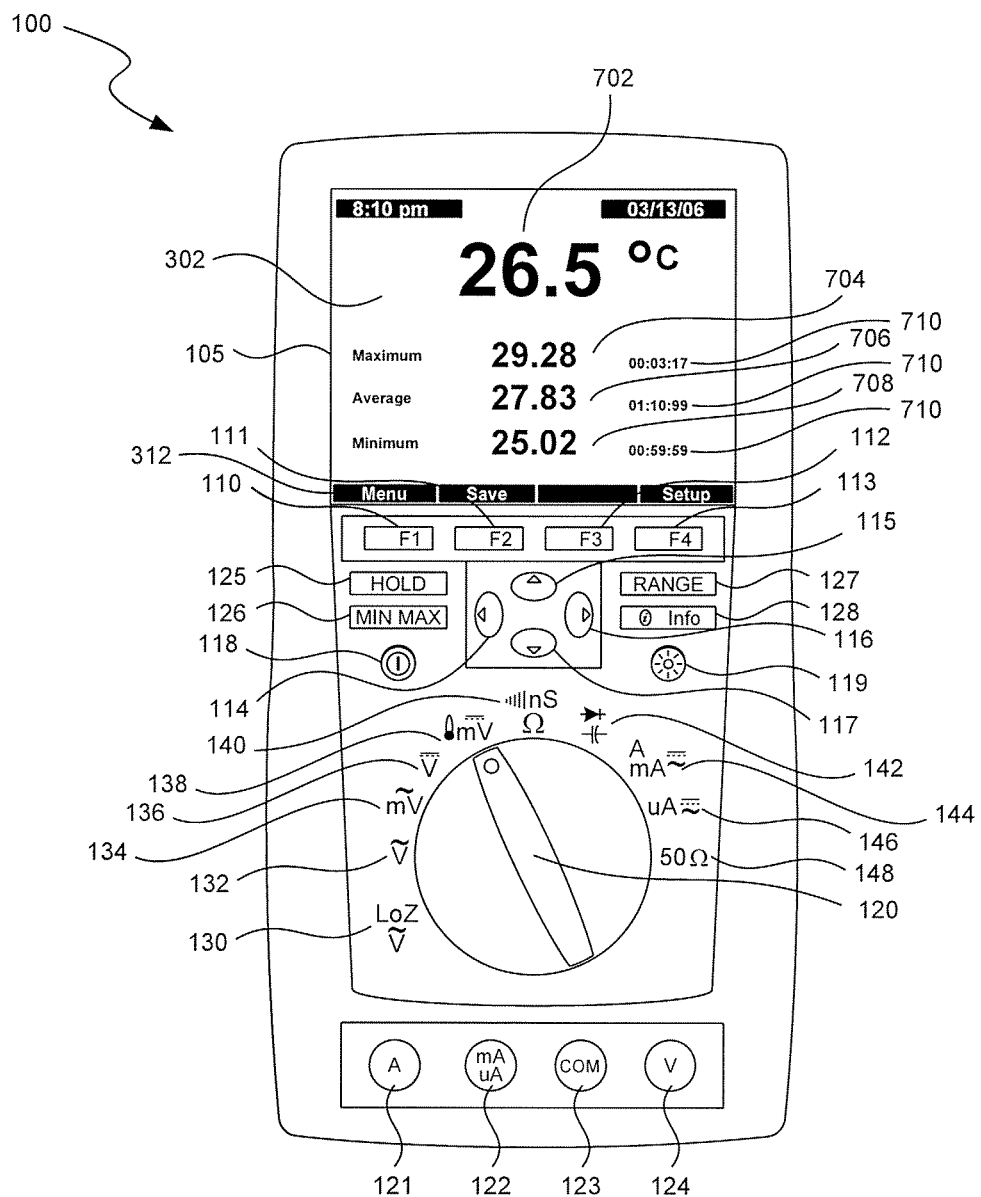
FIG. 7 illustrates a screen that can appear after a user selects the Min/Max mode by pressing a [MIN MAX] button while the multimeter displays the screen shown in FIG. 6.

FIG. 6 illustrates a screen that can be displayed after a user presses soft key 110 when the screen of FIG. 5 is displayed. FIG. 7 illustrates a screen that can appear after a user selects Min/Max mode by pressing [MIN MAX] button 126 while the screen of FIG. 6 is displayed. The screen of FIG. 7 displays a measured voltage "26.5° C." (labeled 702), a maximum measurement value 29.28 (labeled 704), an average measurement value 27.83 (labeled 706), and a minimum measurement value 25.02 (labeled 708). The screen of FIG. 7 further displays time stamps 710 indicating when the minimum, maximum, and average values were obtained.

Multimeter 100 includes a rotary switch memory (RSM) for storing configuration information associated with individual positions of rotary switch 120. The RSM may store any non-default primary measurement function, secondary measurement functions, and mode used by multimeter 100 in conjunction with each position of rotary switch 120. In some examples, the RSM comprises a non-volatile memory to maintain the stored configuration information even when multimeter 100 is turned off.

The RSM operates as follows: When a user moves rotary switch 120 to a new position, multimeter 100 accesses the RSM to determine whether any configuration information has been stored for the new position. If the RSM does not store any configuration information for the new position (or the RSM indicates default configuration information), multimeter 100 will perform the default primary measurement function corresponding to the new position using a corresponding default mode. However, if the RSM stores configuration information for the new position, multimeter 100 will perform any primary measurement function indicated by the configuration information, and will use any mode indicated by the configuration information. Accordingly, if the RSM stores non-default function or mode information, multimeter 100 will operate in accordance with the non-default information without requiring the user to access any menus or press any buttons.

Functions associated with the RSM (hereafter, "RSM functions"), such as functions for storing and applying configuration information, can be configured and/or enabled or disabled from a setup screen. An example setup screen can be accessed by pressing soft button 113 when display 105 shows any of the screens illustrated in FIGS. 1, 3-4, and 6-7. If the RSM is disabled, multimeter 100 simply performs a default primary measurement function using a default mode each time rotary switch 120 changes to a new position. Accordingly, when RSM functions are disabled, a user must access a menu or press a function key to access previously used non-default primary measurement functions or modes. A user can reset the RSM so that multimeter 100 will operate using default primary measurement functions and default modes for all or some positions of rotary switch 120. The user can perform this reset from a reset menu, button, or other input interface.

Returning to the example of FIGS. 1 and 3-7, where RSM functions are enabled, a user can switch multimeter 100 from the configuration of FIG. 7 (Temperature Measurement, Min/Max display mode) directly to the configuration of FIG. 3 (VAC measurement, Min/Max mode) by switching rotary switch 120 from position 138 to position 132. When rotary switch 120 assumes position 132, multimeter 100 accesses the RSM, identifies the prior primary measurement function and mode associated with position 132, and initiates that primary measurement function and mode. Similarly, a user can switch multimeter 100 back to the configuration of FIG. 7 by simply moving rotary switch 120 from position 132 to position 138.

On the other hand, where RSM functions are disabled and multimeter 100 has the configuration of FIG. 3, if a user moves rotary switch 120 from position 132 to position 138, multimeter 100 will automatically return to the screen shown in FIG. 4. In other words, multimeter 100 will assume the default primary measurement function and mode associated with position 132.

In some embodiments, certain modes or functions may not be affected by RSM functions. For instance, to comply with safety standards, multimeter 100 may prevent the RSM from automatically changing the contents of display 105 based on certain modes. As an example, multimeter 100 may prevent the RSM from automatically changing the contents of display 105 to show only low frequency signals (e.g., in a low-pass filter mode) because a user may mistake the displayed low frequency signals for a complete live measurement. As a result, the user may fail to appreciate the possible danger of touching live connections that the user believes to be safe. While multimeter 100 may automatically prevent some modes or functions from being affected by RSM functions, multimeter 100 may also allow a user to specify certain modes or functions that may or may not be affected by RSM functions.

Multimeter 100 may be programmed to perform certain procedures involving a sequence of measurements taken by a user. These procedures may include steps which require the user to change rotary switch 120 to various new positions and/or to select non-default primary measurement functions for different positions of rotary switch 120. When RSM functions are enabled, multimeter 100 can store information for the procedure. For instance, if the procedure requires the user to perform a sequence of non-default primary measurement functions corresponding to different positions of rotary switch 120, the RSM memory may store information to allow the user to automatically access these functions without accessing menus or pressing buttons after moving rotary switch 120. The RSM function can also store any information necessary to resume a procedure in cases where the power supply for multimeter 100 is interrupted for any reason in the middle of the procedure.

In some embodiments, RSM functions are permanently enabled to prevent a user from accidentally losing stored configuration information. In these embodiments, a user may be able to restore default settings for rotary switch 120 by pressing a button or by making a selection from a menu. Additionally, in some embodiments, RSM functions may be permanently enabled for only some positions of rotary switch 120. In these embodiments, a user can control whether RSM functions are enabled in positions for which RSM functions are not permanently enabled.

Figure 8:
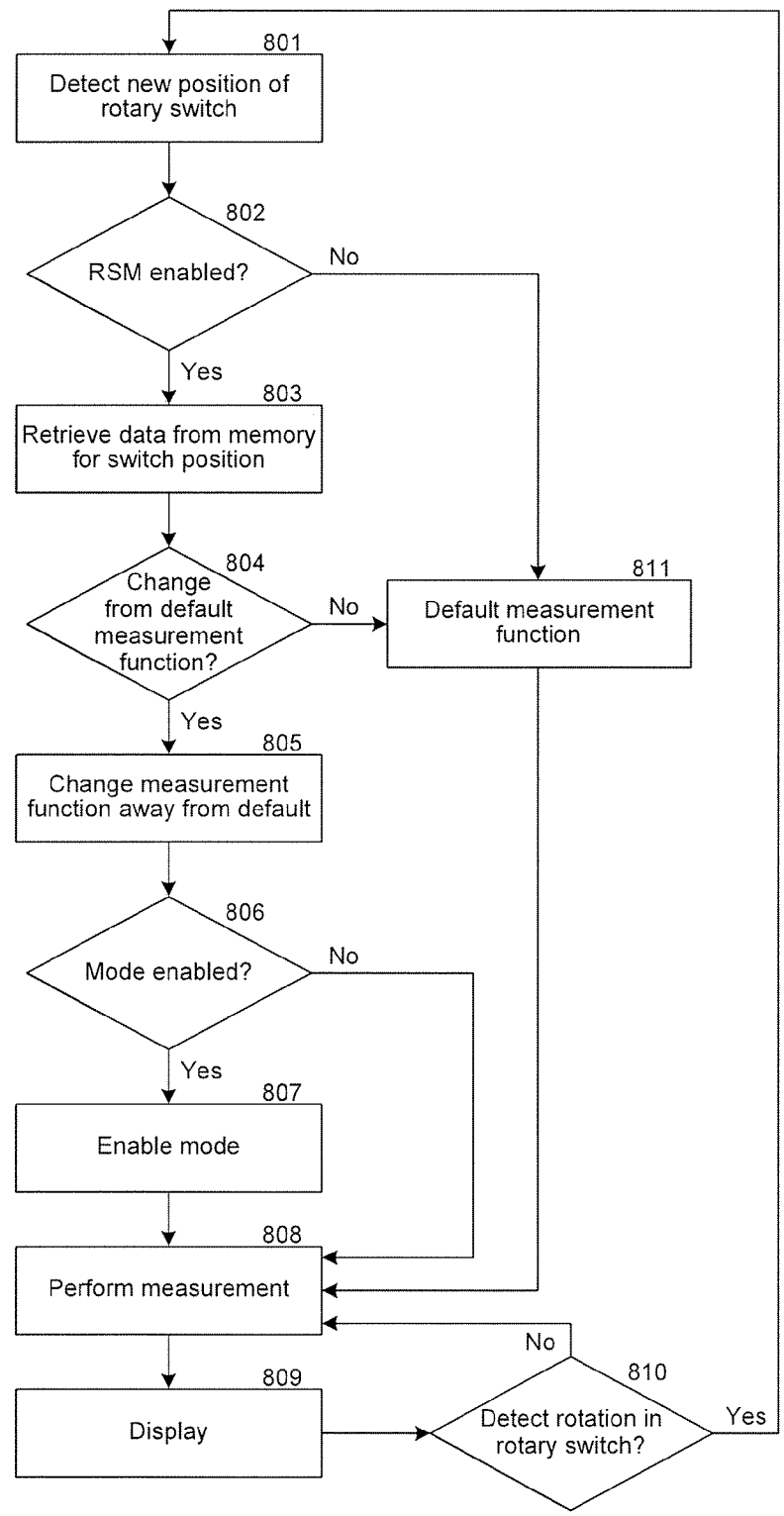
FIG. 8 is a flow diagram illustrating a method of operating the multimeter when a user moves a rotary switch of the multimeter to a new position.

FIG. 8 is a flow diagram illustrating a method of operating multimeter 100 when rotary switch 120 is moved to a new position. In the description that follows, example method steps will be denoted by parentheses (XXX). For explanation purposes, it will be assumed that the method is performed by multimeter 100 under the control of application processors 222. However, it should be understood that the method may be performed by other devices or implemented in different ways.

Referring to FIG. 8, application processors 222 detect movement of rotary switch 120 to a new position (801). Next, application processors 222 determine whether RSM functions have been enabled (802), which can be done, e.g., using a setup menu, as described above. If RSM functions are disabled (802=No) application processors 222 control multimeter 100 to perform the default primary measurement function for the new position of rotary switch 120 (811). Multimeter 100 then performs one or more measurements using the default primary measurement function (808) and displays the measurements on display 105 (809).

If RSM functions are enabled (802=Yes), application processors 222 retrieve data from the RSM for the new position of rotary switch 120. Based on the retrieved data, application processors 222 determine whether the most recent primary measurement function performed at the new position of rotary switch 120 was a default primary measurement function or a non-default primary measurement function (804). If the most recent primary measurement function was a default primary measurement function (804=No), multimeter 100 performs the default measurement function (811) and continues to steps 808 through 810.

Otherwise, if the most recent primary measurement function was a non-default primary measurement function (804=Yes), application processors 222 selects the non-default primary measurement function (805). Then, the application processor determines whether a non-default mode was previously enabled in conjunction with the selected non-default primary measurement function (806). If so, (806=Yes), application processors 222 enable the non-default mode (807), and multimeter 100 continues to steps 808 through 810. Otherwise, (806=No), multimeter 100 continues to steps 808 through 810, performing measurements and displaying the measurements using a default mode for the new position of rotary switch 120. After completing step 809, application processors 822 determine whether rotary switch 120 has been moved to a new position (810). If so (810=Yes), multimeter 100 returns to step 801. If not (810=No), multimeter 100 may take more measurements and display the measurements by returning to step 808.

Dynamically Generated Status Bar Providing Live Measurement Reading

Digital multimeters commonly are used to perform relatively simple measurements of voltage, current, resistivity or other circuitry parameters. When used for this purpose, the instrument typically displays the measured value in a prominent manner on a display screen to apprise a user of the measurement result.

As discussed above, more sophisticated digital multimeters include capabilities to display measurement information beyond simple measurement values, relating to one or more different modes. For selection of at least some of these modes, the resulting measurement value displayed on the instrument is no longer the actual value of the voltage, current, or resistivity across a node in a circuit. Instead, the displayed value corresponds to a different characteristic of the actual measurement associated with the selected mode.

As an unfortunate consequence of utilizing different modes when operating a multimeter instrument, a user may easily be lulled into a misperception that the multimeter display is reporting an actual live measurement reading. As an example, while the hold mode is selected, a user may mistakenly believe that a reading reports an actual live measurement, instead of being a previously recorded value. In some situations, such a misperception could prove to be hazardous to the operator of the instrument.

In an example embodiment of a digital multimeter, an additional display value is provided as a live measurement value to ensure that a user can discern the live actual measurement. However, because a portable, handheld multimeter incorporates a very small digital screen, displaying this value could tend to overcrowd the display or otherwise confuse the user. There thus exists a tension between the advantages of displaying the live, actual measurement prominently for safety considerations, and arranging the display in a manner for easy use with a quick glance at the instrument.

In accordance with the exemplary embodiment, a digital multimeter includes a dynamically generated status bar that provides, in a single, predictable area, dynamically selected information believed to be of significance to a user. As shown in FIG. 1, the status bar may include, for example, a battery strength indicator 158, the time 160 and date 162, and some indication of the instrument setting (speaker set "on") 164. Additionally, when necessary, the status bar may include a display of the live, actual measurement reading, and an icon indicating whether such a reading might be considered dangerous, and to be handled with caution. The status bar(s) may be inversed to indicate a non-live reading. To preserve space on the display screen, the status bar may be positioned at the top of the screen (as shown in FIG. 1), or optionally, at a side or bottom area of the screen. In some embodiments, the positioning of the status bar may be configurable by a user.

Figure 9:
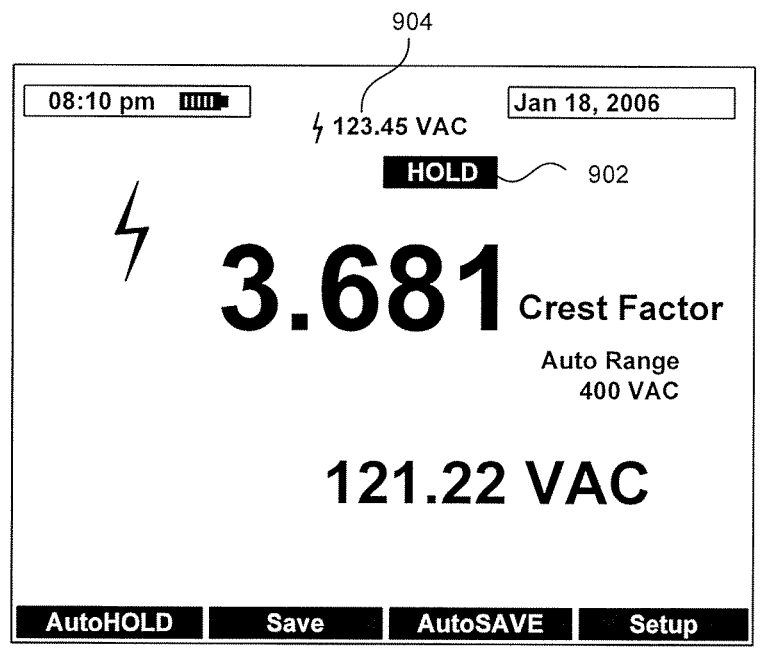
FIG. 9 illustrates a screen simultaneously displaying a "mini-measurement" of a live reading and a frozen measurement of a past reading.

Accordingly, in some embodiments, a mini-measurement can be displayed automatically when the primary measurement function's measurement is not displayed or is otherwise obscured from view on the screen. As yet another example, as shown in FIG. 9, a user may select the "hold" mode for freezing the display of a measurement, such that the main area of display 105 does not report the live, actual reading. As shown in FIG. 9, the status bar includes an indication 902 of the hold mode and a "mini-measurement" 904 informing the user of the live reading while display 105 is frozen with a past reading on hold. The status bar may be inversed to indicate a non-live reading.

As shown in FIG. 9, the status bar displays the live reading with a unit symbol (e.g., VAC, VDC, etc.) or other indication of the type of measurement being displayed. Additionally, when a measurement obtained by a secondary measurement function is displayed in the main area of display 105, the mini-measurement can display a measurement obtained by the corresponding primary measurement function. For instance, if the primary measurement function measures the amplitude of an AC signal and the secondary measurement function measures the frequency of the AC signal, the amplitude may be displayed in the status bar while the frequency is displayed in the main area of display 105. In some embodiments, multimeter 100 allows a user to control whether the mini-measurement is displayed on display 105.

As an additional safety feature, the mini-measurement may be accompanied by a mini lightning bolt (mini bolt) if display 105 is displaying a Volts AC or DC and a potentially hazardous voltage is present. The value that triggers the mini bolt is preferably factory preprogrammed to preserve the integrity of the safety feature. For instance, a user or a manufacturing process could set the mini bolt to appear when multimeter 100 measures a voltage at or above 30 VAC. In some embodiments, the user can set the minimum voltage or other condition triggering the mini bolt to appear, and can alter a factory programmed value.

In some embodiments, primary readings may be accompanied by a comparatively larger lightning bolt (not shown) when a potentially hazardous voltage has been measured or multimeter 100 is being calibrated. If the mini bolt is displayed and a larger lightning bolt accompanying the displayed reading is obscured, the mini-measurement, the mini bolt, or both may blink. Additionally, the mini-measurement may blink when high current is present in the A and mA functions to warn the user that a fuse of multimeter 100 may eventually fail. In some embodiments, a user may be able to set conditions under which the mini bolt will appear and/or blink.

Figure 10:
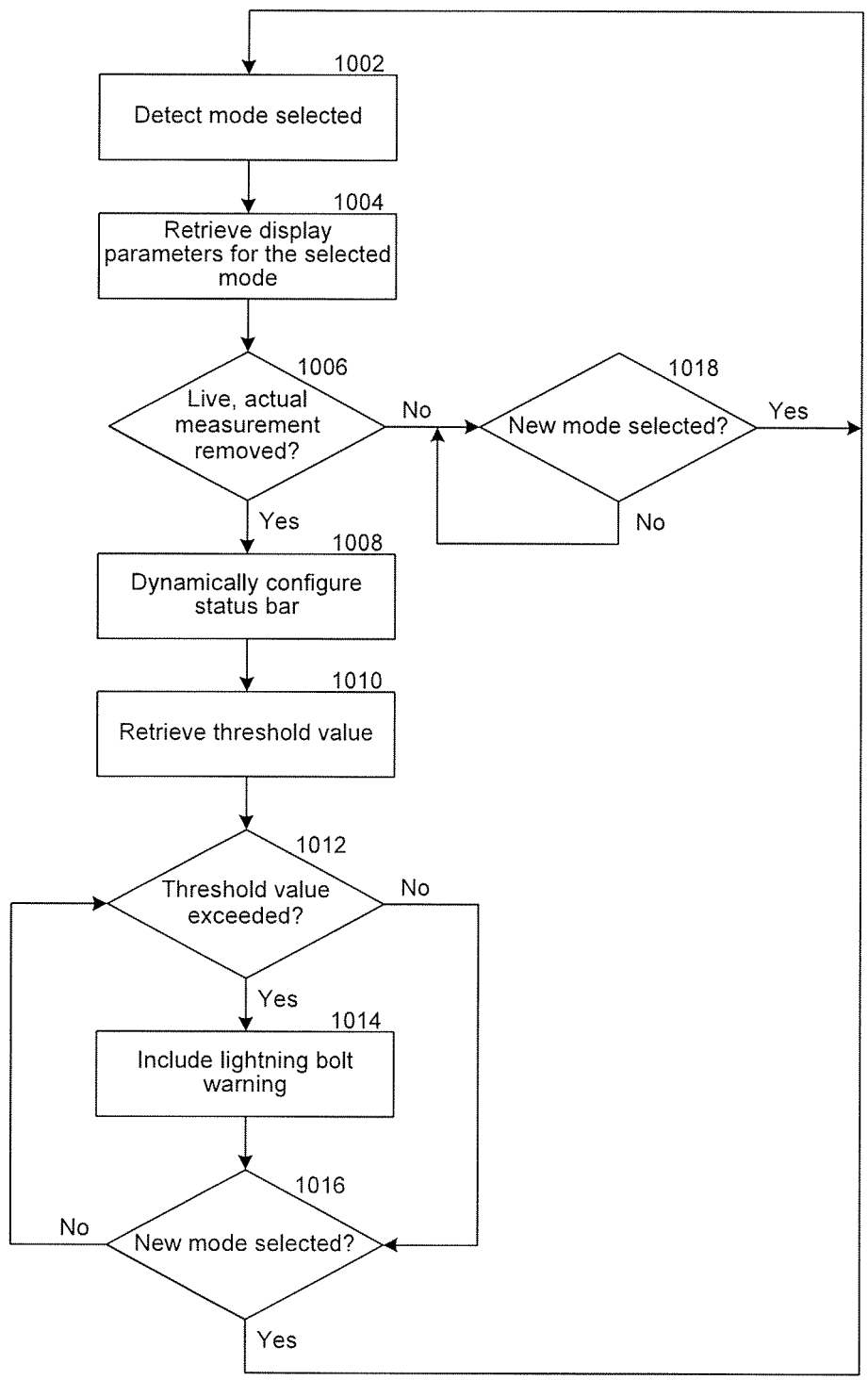
FIG. 10 is a flow diagram illustrating a method for dynamically generating a status bar display in the digital multimeter.

FIG. 10 is a flow diagram illustrating a method for dynamically generating the status bar display in accordance with an exemplary embodiment. For explanation purposes, it will be assumed that the method is performed by multimeter 100 under the control of application processors 222. However, it should be understood that the method could be performed by other devices or implemented in different ways.

In the method, application processor 222 first detects that a user has selected a mode for multimeter 100 (1002). Next, application processor 222 retrieves display parameters from memory 230 corresponding to the selected mode (1004). Next, the method determines whether the display parameters indicate that the live measurements have been removed from the main area of display 105 (1006). If so (1006=Yes), application processor 222 dynamically re-configures the status bar on display 105 to include a live measurement with a reduced font size, as a "mini-measurement" (1008). Otherwise (1006=No), no re-configuration occurs unless a user selects a new mode for multimeter 100.

Next, application processors 222 retrieve from memory 230 a threshold value that was configured by the user or otherwise programmed into memory (1010). Application processor 222 then compares the retrieved threshold value with a live measurement and determines whether the live measurement is above the threshold value (1012). If so (1012=Yes), a lightning bolt warning icon is included in the status bar area (1014), and application processors 222 then determine whether a new mode was selected (1016). Otherwise (1012=No), application processors 222 skip to step 1016 without including the lightning bolt warning icon in the status bar area.

The method of FIG. 10 provides integrated capability to dramatically improve the safety associated with use of a digital multimeter with potential high voltage or high current circuitry. By dynamically re-configuring the status bar area of display 105, multimeter 100 can include extra measurement data when needed, but remove this information from an already-crowded display area when the data otherwise would be redundant. Additionally, the method displays a warning icon, such as a lightning bolt, to notify a user when a live actual measurement has exceeded a voltage threshold value that could threaten the user's safety. By positioning the warning icon in the status bar area, the user can quickly and efficiently check whether its status without otherwise disrupting measurements in progress.

Information Screens

Multimeter users do not frequently carry the instruction manual for the multimeter while using the multimeter. However, as multimeters have become increasingly complex and now incorporate a wide variety of features, it is often helpful to provide technical information to help the users take measurements and interpret the multimeter's output. For instance, the information may help a user to remember what a certain icon represents on a multimeter, or how a particular function of the multimeter is used.

To address the user's need for information, multimeter 100 is configured to display explanatory information about the functions of multimeter 100 when a user presses [Info] button 128. In particular, when the user presses [Info] button 128, multimeter 100 displays explanatory information describing available functions of multimeter 100 and indicating the purpose of visual elements appearing in display 105. In addition to or as an alternative to providing descriptions and indications related to the available functions and visual elements in display, the explanatory information may also instruct a user how to use the functions or interact with the visual elements.

The function of [Info] button 128 is described in further detail below. Although the following description presents a dedicated button as a user input for requesting generation of an information screen, other input techniques may be used as an alternative to the dedicated button.

When a user presses [Info] button 128, multimeter 100 displays a pop-up dialog box including information regarding the functionality of icons and other information on display 105. The displayed information may vary according to the context at the time [Info] button 128 was pressed. For example, [Info] button 128 may be pushed by a user to receive additional information regarding measurement functions such as a function for measuring the voltage level of a direct current, a function for measuring a voltage level of an alternating current, a function for measuring the crest factor of a periodic signal, a function for measuring the duty cycle of a periodic signal, a function for recording a sequence of measurements, or a function for choosing a measurement function. Because the context can vary with the position of rotary switch 120 and various soft key choices, the information displayed can vary according to these variables.

Each screen, menu, and dialog of multimeter 100 potentially can have a corresponding information dialog that can be displayed when a user presses [Info] button 128. When a menu is shown on display 105, a selected item on the menu can determine the context for the information dialog. Alternatively, all menu items can determine the context for the information dialog.

Multimeter 100 may display information on any of several different topics when a user presses [Info] button 128. The topics may include, e.g., instructions for using a function or examples of applications in which a user could employ certain functionality available on the multimeter. As one example, a topic could explain what a certain mode of measuring is and when a user would use the mode. Multimeter 100 can be further programmed by the user to include certain topics in certain contexts. For instance, a company may have a particular procedure for taking measurements in a building. The company could program multimeter 100 to display an information dialog including instructions for performing the company's procedure. By relying on these instructions, the operator can perform the procedure without carrying an instruction manual.

Multimeter 100 can be programmed such that the explanatory information disappears after a predetermined amount of time or upon occurrence of a certain event. Once the explanatory information disappears, multimeter 100 restores any information that was covered or displaced by the explanatory information.

Figure 11:
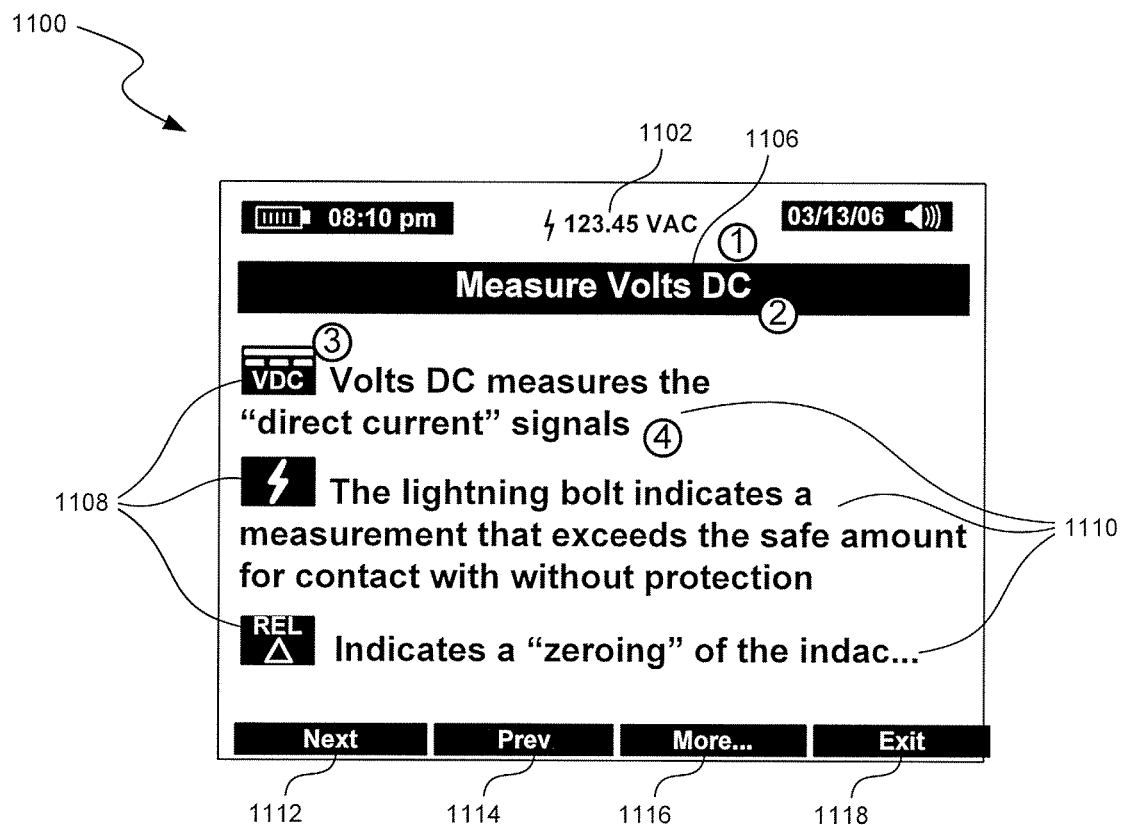
FIG. 11 illustrates an example information dialog displayed on a liquid crystal display (LCD) screen of the digital multimeter.

FIG. 11 shows an example screen 1100 including an information dialog displayed in response to a user pressing [Info] button 128. The information dialog is displayed in place of, or over, current measurements, and thus screen 1100 includes a miniaturized version 1102 of a current measurement. Screen 1100 also includes a title bar 1106 indicating the context in which [Info] button 128 was pressed. In the example of FIG. 11, [Info] button 128 was pressed while multimeter 100 was configured to perform a function for measuring DC voltage. A list of specific topics is provided below title bar 1106.

In the example of FIG. 11, each of the specific topics relates to the context in which [Info] button 128 was pressed. More particularly, each topic is associated with an icon 1108 and a brief explanation 1110 of the icon. Icon 1108 provides an easy way for the user to quickly identify a topic. Additionally, icon 1108 can provide an anchor for each topic so that a user can switch from topic to topic by navigating between icons 1108 using navigation buttons 114-117. The topics shown may be listed in order of relevance to the context. When the user is uncertain about an operation or visible element appearing in the display, the user can push [Info] button 128 to learn about the operation or visible element appearing in the display.

The user can navigate forward and backward between individual topics as well as between different pages of the information dialog. Soft Key 110 can be set to select "Next" 1112, which moves the dialog to a next topic entry. By pressing soft key 110 and looking at icons 1108, the user can move fairly rapidly to different topics of interest. Soft key 110 can be programmed to become disabled once a last topic is reached in the information dialog.

Soft key 111 can be programmed to select "Prev" 1114, which causes screen 1100 to move to a previous topic entry. Soft key 111 can be programmed to become disabled once a first topic is reached in the information dialog. Soft Key 112 can be programmed to operate to select "More . . . " 1116 which allows the user to scroll down the information one page at a time, ignoring topic boundaries. Selecting "More . . . " 1116 can provide a way for the user to continue reading the text accompanying an icon for a topic when only a portion of the text is shown on the display. Soft key 112 can be programmed to become disabled once the end of a topic is reached. The down navigation button can perform the same function as soft key 112 when the information dialog is present. The up navigation button can perform that opposite function of the down navigation button and soft key 112 when the information dialog is present. In other words, the up navigation button can be programmed to provide a way to scroll up the information on the display. The left and right navigation buttons can be disabled when the information dialog is present.

Soft key 113 can be programmed to select "Exit" 1118, which closes the information dialog once soft key 1111 is pressed. There are various other ways the information dialog can be prompted to close. For instance, the user can close the information dialog by pressing [Info] button 128 while the information dialog is present. The information dialog may also be closed by turning the rotary switch to a new position or pressing on/off button 118 or one of dedicated mode buttons 125-127.

[Info] button 128 can be pressed in any context. Title bar 1106 can reflect the context within which the button as pressed. Examples of such contexts include configurations of multimeter 100 in which it is performing or ready to perform any of the following functions: "Measure Volts DC", "Measure Volts AC", "Measuring Crest Factor", "Measuring Duty Cycle", "Recording Measurements", and "Choosing a Measurement Function".

The information dialog may be associated with a scrolling memory that remembers where in the information dialog the user last scrolled during a previous viewing of the information dialog in the same context. Once the user has scrolled to a certain position in the information dialog, the user may toggle between the underlying screen and the information dialog without losing the user's place in the information dialog. For instance, if the user presses [Info] button 128 while measuring Volts AC, the information dialog can pop up to display the first topic listed in the information dialog. Then, if the user scrolls down the information dialog to a fourth listed topic, and then toggles back to the original screen and subsequently back to the information dialog, the information dialog will display the fourth listed topic. In general, toggling can be accomplished by pressing a button on multimeter 100 to change the screen displayed on display 105.

The overview information displayed when [Info] button 128 is pushed can be available in a variety of languages. The overview information can be stored in a compressed format to minimize storage requirements and provide more capacity for storing measurement information.

In the example of FIG. 2, [Info] button 128 may be part of keys/button input 250, which are electrically connected to application processors 222. When a user depresses this [Info] button 128, application processor 222 retrieves information about the current context of multimeter 100 from memory 230. Based on the retrieved context information, application processors 222 retrieve data from memory 230 to be presented in the information dialog on display 200. For instance, application processors 222 may retrieve information regarding icons currently displayed on multimeter 100 or current functions of multimeter 100.

The information dialog presented in display 105 helps a user to take advantage of the various capabilities of multimeter 100. The information dialog is tailored for a small LCD screen provided on multimeter 100. Because multimeter 100 is intended to be portable and self-contained, it is otherwise highly inconvenient to separately carry a user manual. Further, experienced technicians or other users may be unlikely to tote a user's manual, but would benefit from information presented in the information dialog. By incorporating this functionality with the soft-buttons, navigational buttons, and other forms of user input, a user can easily navigate through a vast glossary of information concerning multimeter 100 to find desired information quickly and efficiently.

As another unique aspect of incorporating [Info] button 128 on multimeter 100, a company can re-program or tailor the presentation of information from [Info] button 128 to correspond to particular company procedures or processes associated with measuring electrical circuits. This highly-innovative feature provides a particular, unforeseen benefit in the context of digital multimeters, since it can be used by a fleet of mobile technicians at remote sites, who may be required to follow strict guidelines provided by a company. In accordance with an exemplary embodiment, memory 230 can be programmed for customized information through an associated Flash input, USB port, or other interface.

Referring to FIGS. 2 and 3, in an exemplary embodiment, a user can re-program the information to be presented in response to depressing the [Info] button 128 via a screen presented as part of either the Menu or Setup. Via either a Menu or Setup screen accessible through soft keys 110-113, the multimeter 100 may prompt a user to connect the instrument to a PC via a USB cable at port 270, as depicted in FIG. 3. Alternatively, the application processor 222 in multimeter 100 automatically may switch into a programming mode upon detecting a USB connection. Instead of a USB port, port 270 may be adapted to receive flash memory from which application processor 222 can retrieve data to reconfigure memory section 236. As a further alternative, multimeter 100 may include Bluetooth capability to detect a wireless connection for downloading additional [Info] button data to memory section 236.

Conclusion

Rotary switch memory, mini-measurement display, and Info button glossary access can be integrated into a single multimeter. Alternatively, each can be provided separately, or independently. A user of the multimeter configures the multimeter to enable or disable the rotary switch memory, the mini-measurement or the Info button.

Many specific details of certain embodiments of the invention are set forth in the description and in FIGS. 1-11 to provide a thorough understanding of these embodiments. A person skilled in the art, however, will understand that the invention may be practiced without several of these details or additional details can be added to the invention. Certain well-known structures and functions have not been shown or described in detail to avoid unnecessarily obscuring the description of the disclosed embodiments.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description is not intended to be exhaustive or to limit the invention to the precise form disclosed above. While specific embodiments of, and examples for, the invention are described above for illustrative purposes, various modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily those described above. The elements and acts of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A portable digital multimeter, comprising:
   a display configured to display measurement values and available functions of the multimeter;
   a user interface configured to receive a user input indicating a request for context-sensitive explanatory information regarding the measurement values or the available functions;
   a memory configured to store context-sensitive information relating to the measurement values or the available functions;
   a processor configured to:
   in response to receiving the user input, retrieve the context-sensitive information from the memory to allow the information to be shown on the display; and
   receive from a user custom context-sensitive explanatory information for user specific requirements regarding the displayed measurement values or available functions of the multimeter for storage in the memory and for re-programming previously stored.

2. The portable digital multimeter of claim 1, wherein the processor further controls the display to present the information in a pop-up dialog box.

3. The portable digital multimeter of claim 2, wherein the pop-up dialog box includes a title bar displaying information regarding the multimeter functions in operation at the time when the user input was received.

4. The portable digital multimeter of claim 2, wherein the pop-up dialog box displays indications of the available functions of the multimeter and text explaining the operation of the corresponding functions.

5. The portable digital multimeter of claim 2, wherein the pop-up dialog box has an associated scrolling mechanism for allowing a user to scroll through information within the pop-up dialog box.

6. The portable digital multimeter of claim 2, wherein when the pop-up dialog box is displayed, the processor further controls the display to present a smaller version of the measurement value that was presented on the display immediately prior to the display of the pop-up dialog.

7. The portable digital multimeter of claim 1, wherein the information comprises instructions for performing one or more measurements with the digital multimeter.

8. The portable digital multimeter of claim 1, wherein the information includes a description of a mode of the multimeter.

9. The portable digital multimeter of claim 1, wherein the user input is received in response to actuation of a single button or switch on the multimeter.

10. A portable digital multimeter, comprising:
a display configured to display measurement values and available functions of the multimeter;
a user interface configured to receive a user input indicating a request for context-sensitive explanatory information regarding the measurement values or the available functions;
a memory configured to store the context-sensitive explanatory information;
a processor configured to:
in response to receiving the user input, retrieve from the memory the context-sensitive information to be shown on the display; and
download to the memory user customized context-sensitive explanatory instruction from an external electronic storage medium for re-programming previously stored context-sensitive explanatory information regarding the displayed measurement values or available functions of the multimeter.

11. The portable digital multimeter of claim 10, wherein the user customized context-sensitive explanatory instruction is reconfigurable for user specific requirements.

12. A method of displaying information on a portable digital multimeter, the method comprising:
receiving a user input, wherein the user input indicates a request for information regarding available functions of the multimeter or visual elements displayed on the display screen;
in response to receiving the user input, retrieving information from a memory regarding the available functions or visual elements;
causing to be displayed the retrieved information; and
receiving customized information for user specific requirements regarding the available functions or visual elements displayed on the display screen of the multimeter for storage in the memory and for re-programming previously stored information regarding available functions of the multimeter or visual elements displayed on the display screen.

13. The method of claim 12, further comprising displaying the information in a pop-up dialog box on a display screen.

14. The method of claim 13, wherein the pop-up dialog box comprises a title bar, which includes information regarding the multimeter functions in operation at the time when the user input was received.

15. The method of claim 13, wherein the pop-up dialog box shows the indications of the available functions of the multimeter and text explaining the operation of the corresponding functions.

16. The method of claim 13, wherein the pop-up dialog box has an associated scrolling mechanism for allowing a user to scroll through information within the pop-up dialog box.

17. The method of claim 13, wherein when the pop-up dialog box is displayed, the processor further controls the display to present a smaller version of a measurement value presented on the display immediately prior to the display of the pop-up dialog.

18. The method of claim 12, wherein indications of the available functions of the multimeter comprise graphical icons presented in the display.

19. The method of claim 12, wherein the information is context-sensitive explanatory information and comprises instructions for performing a series of measurements with the digital multimeter and an explanation of a current mode of the multimeter.

20. The method of claim 12, wherein the user input is received in response to actuation of a single button or switch on the multimeter.

21. The portable digital multimeter of claim 1, wherein the context-sensitive explanatory information is customized in response to a customization user input.

22. The portable digital multimeter of claim 1, wherein the user interface includes a navigation tool for indicating on the display the measurement value or function for which context-sensitive explanatory information is requested.

23. The method of claim 12, further comprising reconfiguring the information for user specific requirements.

24. The method of claim 12, further comprising indicating on the display screen available functions or visual elements for which context-sensitive explanatory information is requested.

* * * * *

UNITED STATES PATENT AND TRADEMARK OFFICE
CERTIFICATE OF CORRECTION

PATENT NO. : 8,456,152 B2
APPLICATION NO. : 12/192100
DATED : June 4, 2013
INVENTOR(S) : Anthony Garland et al.

It is certified that error appears in the above-identified patent and that said Letters Patent is hereby corrected as shown below:

In the Claims

Column 20, line 62, after "stored" insert --context-sensitive explanatory information--

Signed and Sealed this
Sixteenth Day of July, 2013

Teresa Stanek Rea
*Acting Director of the United States Patent and Trademark Office*